United States Patent [19]

Rose et al.

[11] 4,432,069
[45] Feb. 14, 1984

[54] MULTIPLEXED MAGNETIC BUBBLE DETECTORS

[75] Inventors: Donald K. Rose; Peter J. Silverman, both of Palo Alto, Calif.

[73] Assignee: Intel Corporation, Santa Clara, Calif.

[21] Appl. No.: 229,345

[22] Filed: Jan. 29, 1981

[51] Int. Cl.³ .............................................. G11C 19/08
[52] U.S. Cl. .................................................. 365/8
[58] Field of Search ............................................ 365/8

[56] References Cited

U.S. PATENT DOCUMENTS

| 3,750,154 | 7/1973 | Almasi   | 365/8 |
| 4,323,983 | 4/1982 | Lee et al. | 365/8 |
| 4,382,288 | 5/1983 | Silverman | 365/8 |

FOREIGN PATENT DOCUMENTS

| 602994 | 3/1978 | U.S.S.R. | 365/8 |

OTHER PUBLICATIONS

IBM Technical Disclosure Bulletin-vol. 19, No. 7, Dec. 1976, pp. 2802-2803.
IBM Technical Disclosure Bulletin-vol. 19, No. 6, Nov. 1976, pp. 1960-1961.

Primary Examiner—James W. Moffitt
Attorney, Agent, or Firm—Blakely, Sokoloff, Taylor & Zafman

[57] ABSTRACT

A multiplexed magnetic bubble detector is described which includes a pair of detectors each having a propagation element and an underlying detector element. In one of the detectors the detector element is at the leading edge of the propagation element and in the other the element is at the trailing edge of the propagation element. The outputs from the detector elements are coupled in a bridge circuit with dummy detector elements.

8 Claims, 7 Drawing Figures

MULTIPLEXED MAGNETIC BUBBLE DETECTORS

BACKGROUND OF THE INVENTION

1. Field of the Invention.

The invention relates to the field of magnetic bubble detection.

2. Prior Art.

In the fabrication of magnetic bubble (single wall domain) devices, particularly magnetic bubble memories, it is important to limit the number of connections that must be made between the memory substrate and external circuits. Also, it is advantageous to use as few as possible external circuits and to have, for example, the same driving circuit power two bubble generators. In copending application Ser. No. 25,848, filed Apr. 2, 1978 amd now U.S. Pat. No. 4,272,817 entitled "Multiplexed Single Wall Domain Generators", (assigned to the assignee of the present application), a system is described for multiplexing bubble generators. As will be seen, the present invention teaches an apparatus for multiplexing the outputs of bubble detectors.

There have been attempts in the past to multiplex bubble detector outputs. In one scheme, four chevron detectors are formed at different angular orientations. For example, the detectors are oriented each 90 degrees from the other, like spokes of a wheel. Then, the detectors are coupled to a common sensing circuit. One problem with this scheme is described in conjunction with FIG. 3a of the specification.

Another aspect of the present invention is a method for optimizing the signal level output from each of the multiplexed bubble detectors. One process for adjusting the signal level from a magnetic bubble detector is described in copending application Ser. No. 163,574 filed June 27, 1980, now U.S. Pat. No. 4,300,209 entitled "Method for Adjusting Signal Level Output from Magnetic Bubble Detector", assigned to the assignee of the present application.

SUMMARY OF THE INVENTION

A magnetic bubble detection apparatus is described which includes a first and second magnetic bubble detector. The first bubble detector includes a first propagation element which propagates bubbles from its leading edge to its trailing edge under the influence of a rotating magnetic field. This first detector also includes a first detection element disposed in the region of the leading edge of the first propagation element. A bubble passing through the detector is detected as it is transferred along the leading edge of the first propagation element. The second magnetic bubble detector also includes a propagation element which propagates bubbles from its leading edge to its trailing edge under the influence of the rotating magnetic field. A second detector element is disposed in the region of the trailing edge of this second propagation element. A bubble being propagated by the second propagation element is sensed when the bubble is at the trailing edge of the second propagation element. In this manner, the outputs from the first and second detector elements may be readily multiplexed since they occur at different times during each cycle of the rotating magnetic field.

BRIEF DESCRIPTION OF THE DRAWINGS

FIG. 3a illustrates a chevron detector and the output from this detector.

FIG. 3b illustrates a bubble detector which includes a separate detector element, and the output from this element when the element is disposed in the region of the leading edge of the propagation element.

FIG. 3c illustrates a bubble detector which includes a separate detector element, and the output from this element when the element is disposed in the region of the trailing edge of the propagation element.

DETAILED DESCRIPTION OF THE INVENTION

A magnetic bubble detection apparatus is described which provides multiplexed outputs from two separate detectors. With the invented apparatus two independent streams of bubbles are detected with separate detector elements and the resultant signal from these separate elements is sensed on a single pair of lines. This reduces the number of package pins required, and moreover, the number of sense amplifiers needed for detection.

In the following description numerous specific details are set forth such as specific thicknesses, etc. in order to provide a thorough understanding of the present invention. It will be obvious to one skilled in the art that the present invention may be practiced without these specific details. In other instances, well-known structures and processes are not set forth in detail, in order not to obscure the present invention in unnecessary detail.

Figure 1:
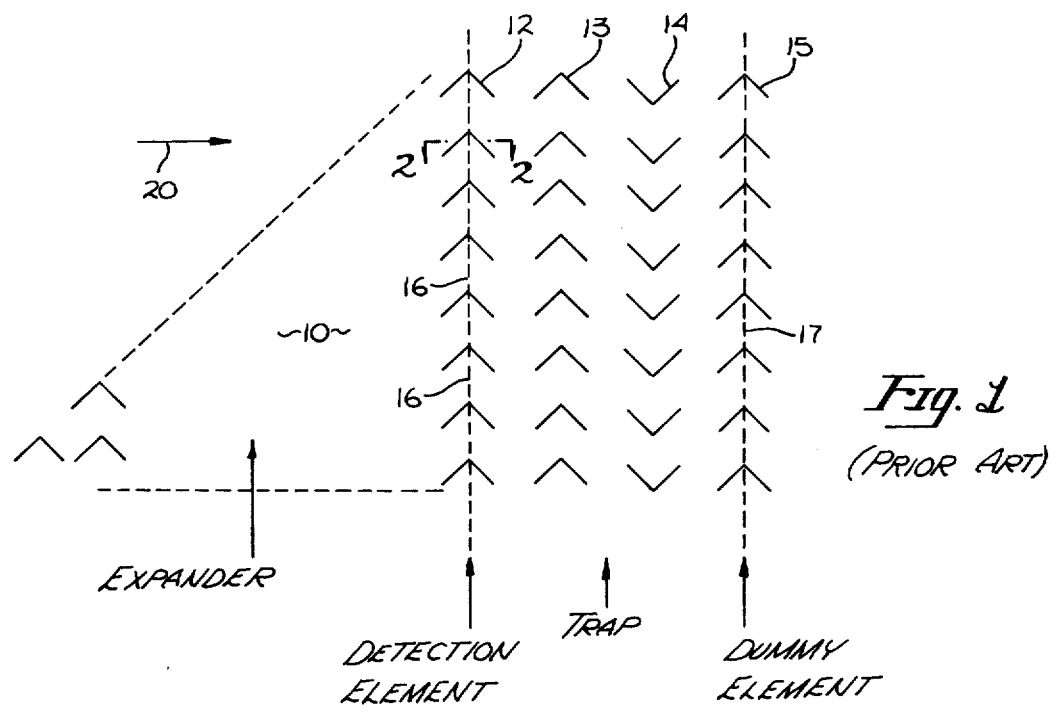
FIG. 1 is a plan view of a prior art magnetic bubble detector.

Referring now to FIG. 1, a prior art bubble detector is illustrated which includes an expander section 10, a propagation element 12 which comprises a column of chevrons, a bubble trap defined between chevron columns 13 and 14, and an additional column of chevrons 15. A magnetic bubble, as it is propagated past the element 12, is detected by an elongated detector element (strip of magnetoresistive material) disposed below element 12. As is generally the case, magnetic bubbles are moved into the detector of FIG. 1 in the direction 20 under the influence of an in-plane rotating magnetic field. As the bubbles are propagated past the column of chevrons 12, the resistance of the underlying detector element is changed, and this change is sensed. Bubbles are then propagated onto element 13 and become trapped between the elements 13 and 14.

An additional column of chevrons 15 which is identical to the column of chevrons 12, and an additional "dummy detector" element 17 which is identical to the detector 16 is disposed adjacent to the trap. Even though elements 15 and 17 do not receive and sense bubbles, they are affected by the rotating magnetic field. The signal from the element 17 is used as a reference signal to effectively cancel (reject) the effects of the rotating magnetic field on the element 16.

Figure 2:
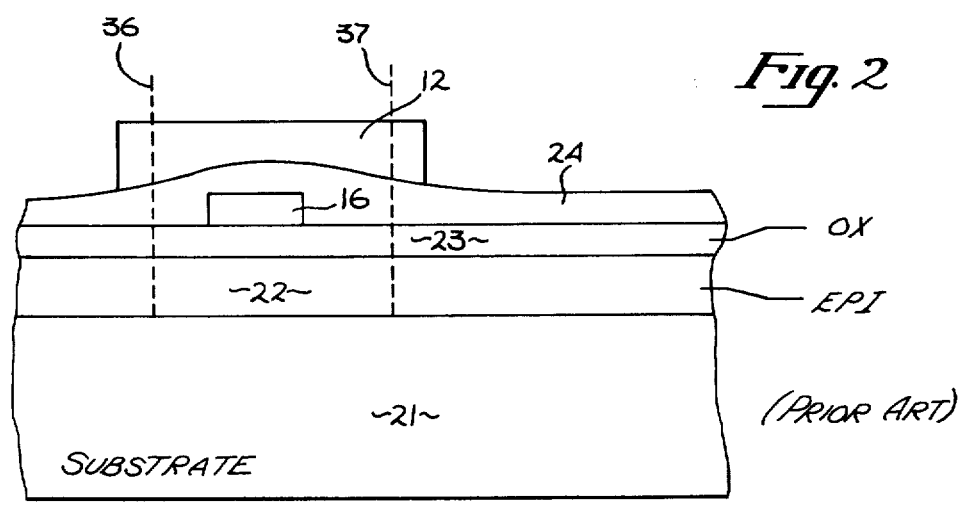
FIG. 2 is a cross-sectional elevation view of a portion of the detector of FIG. 1 generally taken through section line 2-2 of FIG. 1.

In FIG. 2 only those layers of a memory or other device needed to view the detector of FIG. 1 are shown. The structure is formed on a substrate 21 which is typically a garnet substrate. An ion implanted magnetic garnet (epitaxial layer 22) is employed on the substrate for the magnetic bubble storage layer. The single wall domains are moved in this layer as is well-known. A silicon dioxide layer 23 which is approximately 1500A thick is formed over the epitaxial layer. Then the detector element 16 is fabricated on the layer 23 using ordinary photolithographic techniques from a magnetoresistive material such as permalloy. The detector element 16, in the presently preferred embodiment, is approximately 2 microns wide and approximately 500A thick. An additional oxide layer is formed over layer 23 to insulate the detector 16 from the overlying permalloy members. This oxide layer 24 is approximately 1500A thick. Then, the permalloy propagation elements such as the column of chevrons 12 are formed over the oxide layer 24 in a well-known manner.

Figure 3A:
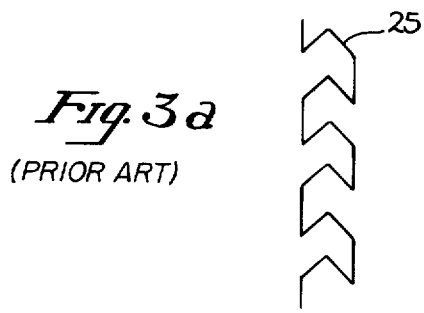
FIGS. 3a -3c illustrate various detector elements and the outputs from the elements.
Figure 3A:
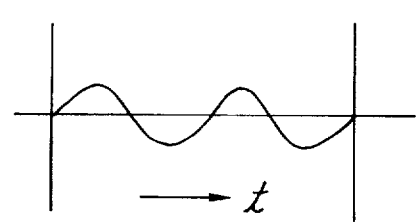
Figure 3B:
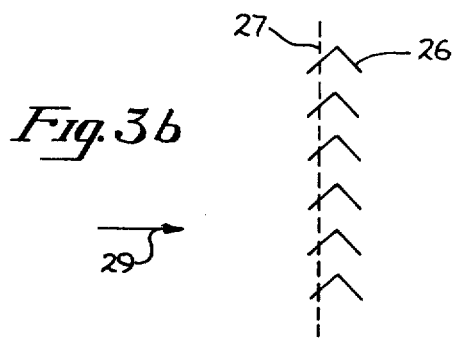
Figure 3B:
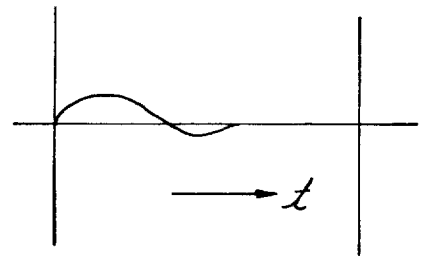
Figure 3C:
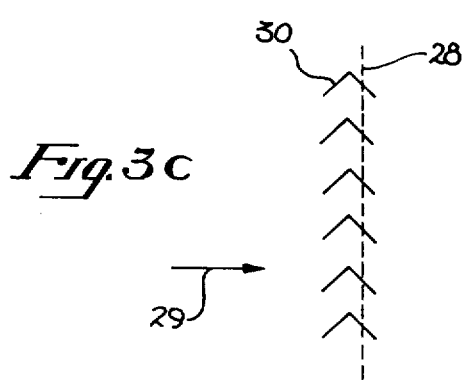
Figure 3C:
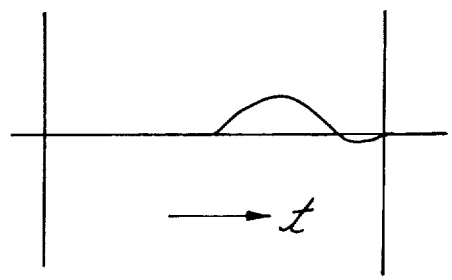

The present invention may be best understood with reference to the diagrams of FIG. 3c. In FIG. 3a, a prior art chevron detector 25 is illustrated which comprises a plurality of interconnected chevrons. When a bubble is moved through this chevron detector under the influence of a rotating magnetic field, the waveform shown to the right of detector 25 results for each cycle of the rotating magnetic field. As can be appreciated, it is difficult to multiplex a number of outputs from detectors such as detector 25 because of the resultant waveform.

In FIG. 3b, a detector similar to the detector shown in FIG. 1 is illustrated, however, the detector element 27 is disposed in the region of the leading edge of the propagation element 26. Assuming bubbles are moving in the direction of arrow 29, they first reach a first edge of the element 26 (leading edge) and then are propagated to the opposite edge (trailing edge) of the element. For the relative location of the detector element 27 and propagation element 26 of FIG. 3b, a bubble is sensed by the detector during the first part of each cycle of the rotating magnetic field as shown to the right of elements 26 and 27 (ignoring the effects of the rotating magnetic field on the detector element).

In FIG. 3c, another propagation element 30 is illustrated with an underlying detection element 28. This time, however, the detection element 28 is disposed in the region of the trailing edge of the element 30. In this position, a bubble is sensed towards the end of each cycle of the rotating magnetic field as indicated by the graph shown to the right of elements 28 and 30.

The appreciation that during a cycle of the rotating magnetic field a bubble can be sensed at different portions of this cycle (compare FIG. 3b and FIG. 3c) is put to use for multiplexing purposes as taught by the present invention.

Figure 4:
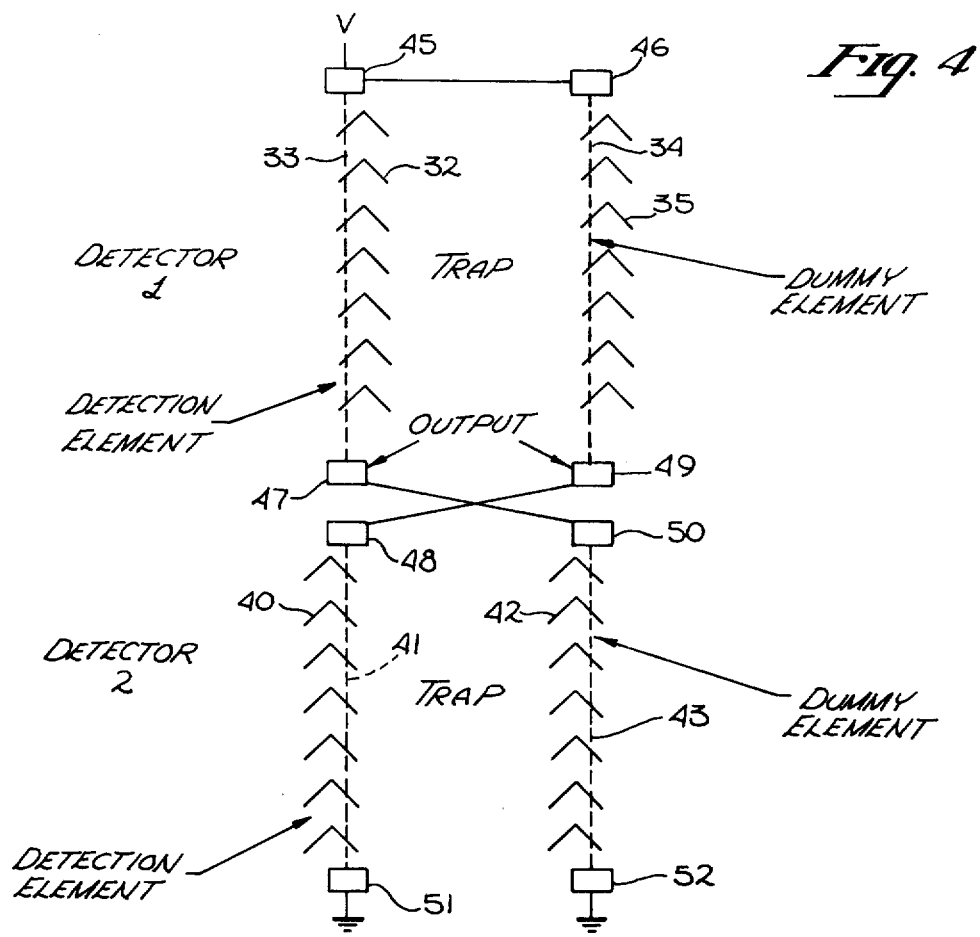
FIG. 4 is a schematic of the detection apparatus of the present invention, in its presently preferred embodiment.

Referring now to FIG. 4, in the presently preferred embodiment, the detector elements of two detectors are coupled in a bridge circuit. Detector 1 of FIG. 4 includes an expander section not illustrated which expands bubbles and propagate them into propagation element 32 (a column of chevrons). The bubbles are then propagated into a trap which is disposed between the column of chevrons 32 and the columns of chevrons 35. A magnetoresistive detection element 33 is disposed beneath the propagation element 32 in the region of the leading edge of the element 32. An identical element, dummy element 34, is disposed in the region of the leading edge of the column of chevrons 35. Element 33 is electrically coupled between contacts 45 and 47, and the dummy element 34 is coupled between the contacts 46 and 49. Referring briefly to FIG. 2, for the detector 1 of FIG. 4, the detector element 33 and dummy element 34 would be centered about the line 36 and again insulated from the overlying chevrons.

Detector 2 of FIG. 4 again includes an expander section not illustrated which propagates bubbles into the propagation element 40. Disposed beneath the propagation element 40 is a detector element 41 which again comprises a magnetoresistive material. The element 41 is coupled between the contacts 48 and 51. The element 41 is in the general region of the trailing edge of the propagation element 40. A trap is disposed between the propagation element 40 and the column of chevrons 42. A dummy element 43 is disposed beneath the column of chevrons 42 in the region of the trailing edge of chevrons 42. This dummy element is connected between contacts 50 and 52. Referring briefly to FIG. 2, the detector element 41 and element 43 would be centered on line 37 for detector 2 of FIG. 4. (Note that the precise location of the detector elements and dummy elements relative to the leading edge and trailing edge of the propagation element is not particularly critical.)

The layout (in terms of size and orientation relative to the rotating magnetic field) of elements 32 and 33 when compared to elements 35 and 34, respectively, is identical to provide proper electrical performance. The same is true for elements 40 and 41, and elements 42 and 43, respectively. (This, of course, is true for the prior art detector of FIG. 1).

The detector 1 and detector 2 of FIG. 4 are coupled in a bridge circuit. A potential is applied to the contacts 45 and 46. Contact 47 is coupled to contact 50, and contact 48 is coupled to contact 49. The contacts 51 and 52 are coupled to ground. In this bridge circuit, the dummy elements null out the effect of the rotating magnetic field on the detector elements and allow the bubbles passing through the propagation elements 32 and 40 to be sensed. The output signal from the detectors is taken from contacts 47 and 49 which contacts are typically coupled to package pins, and via lines on a printed circuit board to a sense amplifier.

By knowing the portion of a cycle of the magnetic field during which a bubble is detected (or not detected) the output from each of the detectors 1 and 2 is known.

Referring again to FIG. 3, the output sensed from the bridge circuit of FIG. 4 (and at the sense amplifier) consists of a graph of FIG. 3b superimposed on the graph of FIG. 3c. It is apparent that the signal caused by a bubble moving through element 32 of FIG. 4 can readily be discerned from a bubble moving through element 40 even though the bubbles move through these column of chevrons at the same time. The "quiet period" (no signal) region of FIG. 3c falls within the period when a signal is generated in FIG. 3b, and vice versa.

It has been found that the output from the detector elements such as detector elements 33 and 41 of FIG. 4 can be optimized by having the width to thickness ratio of these elements equal to a predetermined number. By way of example, with a prior art chevron detector (FIG. 3a), output signals of approximately 5mv are typical. By controlling the w/t ratio of the detector elements used in the present invention, output signals of approximately 20mv are obtained. (This assumes the length of chevron detector is approximately equal to the length of the element 33 or 41.

Through empirical determination it has been found that the ratio w/t for the detector element (see FIG. 5) should be approximately equal to 100 for maximum output where a typical permalloy is used. (In the presently preferred embodiment, the permalloy comprises 81% nickel and 19% iron). Due to process variations the w/t ratio can vary as much as +20%. These variations, particularly at the extremes, substantially deteriorate the output from the detector elements.

Figure 5:
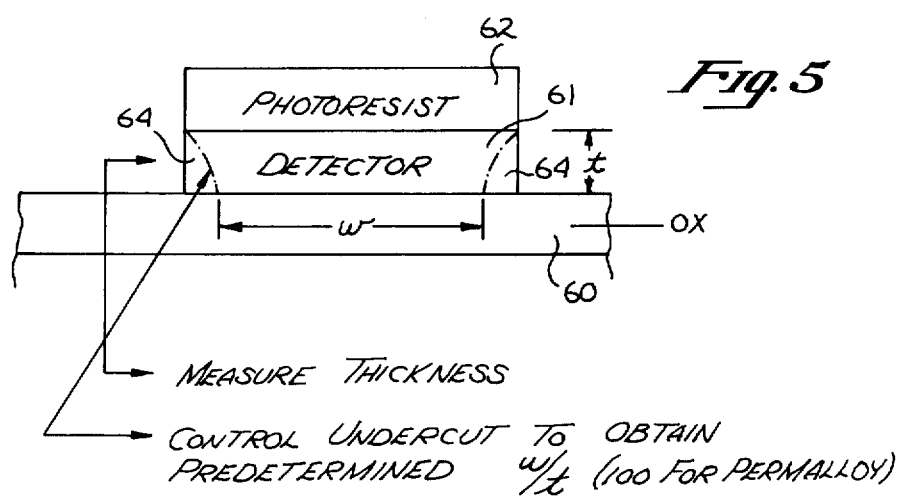
FIG. 5 is a cross-sectional elevation view illustrating processing steps used to define the detector element used in the present invention and to optimize its output.

During fabrication in the presently preferred process, the layer from which the detector element 61 of FIG. 5 is etched, is first formed over the oxide layer 60. (The detector element 61 corresponds to the elements 33,34, 41 or 43 of FIG. 4.) Ideally, as presently implemented, this layer should be 500A thick (assuming w=2 microns and t=500A). After the fabrication of the layer, its thickness is checked, for example, by checking the sheet resistance of the layer. Once the thickness is known, the desired width is likewise known since the w/t ratio should be approximately 100. A photoresist layer is formed over the permalloy layer and with an ordinary masking step, a masking member 62 is formed which is used to define the detector 61. If the thickness of the layer is 500A, the width should be approximately 2 microns. In the presently preferred embodiment, the width of the masking member 62 is made wider than 2 microns, for example, 2.5 microns. Then the etching step used to etch the permalloy layer is controlled to provide an undercutting 64 under the photoresist member 62. This controlled undercutting is allowed to continue until the desired width w is achieved. As is well-known, this etching can be quite precisely controlled.

The thickness of the permalloy layer is generally quite uniform over the entire wafer. Thus, all the detector elements (and dummy elements) on a given wafer will require the same etching time and can be formed with one masking and etching step.

The same result can be achieved by first forming an extra thick permalloy layer from which the detectors are to be etched. For example, instead of attempting to achieve a 500A thickness, a 750A thickness is sought. Then, after the etching with a photoresist member such as member 62 of FIG. 5, the width to thickness ratio is measured. For this case member 62 has a width of approximately 2 microns and no undercutting is attempted. It, of course, would be expected that the ratio w/t is less than 100 since the permalloy layer was intentionally made thick. The detector elements are then etched to decrease their thickness until the desired thickness is achieved. This etching is preferably done with ion milling with the entire wafer being subjected to such milling.

Thus, a magnetic bubble detection apparatus has been described which permits the multiplexing of the outputs from two detector elements. A method has also been described for optimizing the output from these detector elements.

I claim:

1. A magnetic bubble detection apparatus comprising:

a first magnetic bubble detector including a first propagation element which propagates bubbles from its leading edge to its trailing edge under the influence of a rotating magnetic field, and a first detection element insulated from said first propagation elements and disposed in the region of said leading edge of said first propagation element so as to sense the presence of a bubble as it is propagated through the region of said leading edge of said first propagation element; and, a second magnetic bubble detector including a second propagation element which propagates bubbles from its leading edge to its trailing edge under the influence of said rotating magnetic field, and a second detection element insulated from said second propagation element and disposed in the region of said trailing edge of said second propagation element so as to sense the presence of a bubble as it is propagated through the region of said trailing edge of said second propagation element;

whereby the outputs from said first detection element and second detector element may be multiplexed.

2. The apparatus defined by claim 1 wherein said first and second propagation elements are each a column of chevrons.

3. The apparatus defined by claim 2 wherein said detection elements comprise a magnetoresistive material.

4. The apparatus defined by claim 3 wherein the width to thickness ratio of said detection elements equals approximately 100.

5. A magnetic bubble detection apparatus comprising:

a first magnetic bubble detector including:

a first column of chevrons for receiving magnetic bubbles;

a first detection element for detecting the presence of a magnetic bubble, said first detection element disposed below said first column of chevrons adjacent to the first edge of said first column of chevrons;

a second column of chevrons;

a first magnetoresistive element disposed below said second column of chevrons adjacent to the first edge of said first magnetoresistive element;

a second magnetic bubble detector including:

a third column of chevrons for receiving magnetic bubbles;

a second detection element for detecting the presence of a magnetic bubble, said second detection element disposed below said third column of chevrons adjacent to the second edge of said third column of chevrons, said second edge being opposite to said first edge of said first detection element;

a fourth column of chevrons;

a second magnetoresistive element disposed below said fourth column of chevrons adjacent to the second edge of said fourth column of chevrons, said second edge being opposite to said first edge of said first magnetoresistive element;

whereby said first and second magnetic detectors may be coupled in a bridge circuit with said circuit providing multiplexed outputs.

6. A magnetic bubble detection apparatus comprising:

a first magnetic bubble detector including:

a first propagation element for receiving a magnetic bubble, said propagation element for propagating said magnetic bubble from the leading edge to the trailing edge of said first propagation element under the influence of a rotating magnetic field;

a first detection element for detecting a magnetic bubble disposed below and insulated from said first propagation element, said first detection element disposed in the region of said leading edge of said first propagation element; and, a second magnetic bubble detector including:

a second propagation element for receiving a magnetic bubble, said propagation element for propagating said magnetic bubble from the leading edge to the trailing edge of said second propagation element under the influence of said rotating magnetic field;

a second detection element for detecting a magnetic bubble disposed below and insulated from said second propagation element, said second detection element disposed in the region of said trailing edge of said second propagation element;

whereby signals from said first and second detection may be multiplexed.

7. The apparatus defined by claim 6 wherein said first and second propagation elements are columns of chevrons.

8. The apparatus defined by claim 6 wherein said first and second detection elements each have a thickness to width ratio of approximately 100.

* * * * *